United States Patent
Miyachi

(10) Patent No.: US 11,665,966 B2
(45) Date of Patent: May 30, 2023

(54) PIEZOELECTRIC ACTUATOR

(71) Applicant: STANLEY ELECTRIC CO., LTD., Tokyo (JP)

(72) Inventor: Mamoru Miyachi, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 1199 days.

(21) Appl. No.: 16/222,236

(22) Filed: Dec. 17, 2018

(65) Prior Publication Data

US 2019/0189896 A1    Jun. 20, 2019

(30) Foreign Application Priority Data

Dec. 20, 2017    (JP) .............................. JP2017-244300

(51) Int. Cl.
| H10N 30/20 | (2023.01) |
| G02B 26/08 | (2006.01) |
| H01L 23/525 | (2006.01) |
| H10N 30/87 | (2023.01) |

(52) U.S. Cl.
CPC ..... *H10N 30/2042* (2023.02); *G02B 26/0858* (2013.01); *H01L 23/5256* (2013.01); *H10N 30/875* (2023.02)

(58) Field of Classification Search
CPC .............. H01L 41/0475; H01L 41/0825–0993
See application file for complete search history.

(56) References Cited

U.S. PATENT DOCUMENTS

| 7,595,581 B2 | 9/2009 | Aoki et al. |
| 9,612,434 B2 | 4/2017 | Yasuda |
| 2016/0341956 A1* | 11/2016 | Yasuda ............... H01L 41/0471 |

FOREIGN PATENT DOCUMENTS

| JP | H01105569 A | 4/1989 |
| JP | 2001332956 A | 11/2001 |
| JP | 2007273589 A | 10/2007 |
| JP | 2014146270 A | 8/2014 |
| JP | 2016219603 A | 12/2016 |

OTHER PUBLICATIONS

Translation of Yamada JP2001332956, translation on Aug. 27, 2022 (Year: 2022).*
Japanese Office Action dated Sep. 14, 2021 issued in Japanese Application No. 2017-244300.
Japanese Office Action dated Dec. 21, 2021 (and English translation thereof) issued in Japanese Application No. 2017-244300.

\* cited by examiner

*Primary Examiner* — Amar Movva
(74) *Attorney, Agent, or Firm* — Holtz, Holtz & Volek PC

(57) ABSTRACT

A piezoelectric actuator is formed like a rectangular flat plate, and includes a substrate layer, a lower electrode layer, a piezoelectric layer, and an upper electrode layer formed in this order from bottom to top in a thickness direction. The upper electrode layer is constituted of a plurality of electrode segments separated in a surface direction, and connection wires connecting the electrode segments which are adjoining in the surface direction.

17 Claims, 6 Drawing Sheets

PIEZOELECTRIC ACTUATOR

BACKGROUND OF THE INVENTION

1. Field of the Invention

The present invention relates to a piezoelectric actuator to be installed in a light deflector or the like.

2. Description of the Related Art

Japanese Patent Application Laid-Open No. 2016-219603 describes a piezoelectric actuator to be installed in a light deflector of micro electro mechanical systems (MEMS). The piezoelectric actuator is formed like a rectangular flat plate and includes a substrate layer, a lower electrode layer, a piezoelectric layer, and an upper electrode layer, which are formed in this order from bottom to top in the thickness direction.

In a piezoelectric actuator, the piezoelectric layer has a void or crack, a foreign matter (contaminant) is mixed in the piezoelectric layer, or further, a surface of the piezoelectric layer has a small dent or projection in some cases. These defects in the piezoelectric layer tend to lead to a breakdown of the piezoelectric layer in a piezoelectric actuator, in which an electric field (applied voltage) of, for example, 10 V/μm or more is applied to the piezoelectric layer.

Focusing on the fact that the breakdown of the piezoelectric layer tends to occur along column crystals of a piezoelectric, the piezoelectric actuator described in Japanese Patent Application Laid-Open No. 2016-219603 has an electrically conductive thin film placed in between the lower electrode layer and the upper electrode layer, and the column crystals of the piezoelectric layer are formed in steps, dividing the column crystals into those on the lower side and the upper side of the electrically conductive thin film. With this arrangement, one column crystal does not continue in between the lower electrode layer and the upper electrode layer, thus forming two discrete column crystals below and above the electrically conductive thin film. This suppresses the breakdown of the piezoelectric layer.

SUMMARY OF THE INVENTION

An object of the present invention is to provide a piezoelectric actuator capable of blocking the propagation of a breakdown of a piezoelectric layer to a surrounding area thereof so as to minimize the functional loss of the piezoelectric layer by a unique configuration in case of the occurrence of the breakdown of the piezoelectric layer.

A piezoelectric actuator in accordance with the present invention is a piezoelectric actuator which is formed like a rectangular flat plate and in which a substrate layer, a lower electrode layer, a piezoelectric layer, and an upper electrode are formed in this order from bottom to top in a thickness direction, wherein the upper electrode layer is constituted of a plurality of electrode segments separated in a surface direction, and connection wires connecting the electrode segments which are adjoining in the surface direction.

A first breakdown of the piezoelectric layer in a piezoelectric actuator tends to take place, in the surface direction, at a position in the surface direction where a defective part of the piezoelectric layer exists, and at the time of a breakdown, a high current is generated that passes through, in the thickness direction, the position in the surface direction. At this time, the high current leaks to the surrounding area in the vicinity of the position in the surface direction, so that the surrounding area also incurs the breakdown, and the breakdown propagates in a chain-reaction manner to the surrounding area in succession in the surface direction, thus expanding at once in the surface direction.

According to the present invention, the upper electrode layer is separated into a plurality of electrode segments in the surface direction. Therefore, even if a breakdown occurs, causing a high current to pass between the upper electrode layer and the lower electrode layer and the high current to propagate in succession to the surrounding area in the surface direction from a first breakdown position, the propagation range in the surface direction will be limited to an electrode segment immediately above a place of the breakdown of the piezoelectric layer. As a result, even if a breakdown takes place in a piezoelectric layer, the propagation of the breakdown to the surrounding area can be blocked, thus making it possible to minimize the functional loss of the piezoelectric layer.

Preferably, in the piezoelectric actuator according to the present invention.

the upper electrode layer is separated into a plurality of the electrode segments in both longitudinal and lateral directions of the surface direction, and each electrode segment is connected through the connection wires to electrode segments that are adjoining in both directions.

A drive voltage (an applied voltage difference of the piezoelectric layer) is supplied to each electrode segment through a connection wire from an adjoining electrode segment on an upstream side in the direction in which an applied voltage is supplied. Hence, if the separation to a plurality of electrode segments is performed only in one of the longitudinal direction and the lateral direction of the surface direction, then even if the spreading of a breakdown in the surface direction can be suppressed, power feeding to the electrode segments on a downstream side in a power feeding direction from the electrode segment that has incurred a breakdown will be inconveniently cut off when resuming the use thereafter.

On the other hand, according to the configuration, the upper electrode layer is separated into a plurality of electrode segments in both longitudinal and lateral directions, so that power will be supplied to the electrode segments located on the downstream side in the feeding direction from the electrode segment, which has incurred a breakdown, through a path constituted of a plurality of electrode segments free of a breakdown.

Preferably, in the piezoelectric actuator according to the present invention, each electrode segment has the same size and shape.

The configuration described above enables the upper electrode layer to have a simpler structure. The sizes and shapes of the electrode segments can be set to be different according to a position in the surface direction.

Preferably, in the piezoelectric actuator according to the present invention, the upper electrode layer is formed of a material that has a higher melting point than that of the piezoelectric layer.

If the material of the upper electrode layer melts due to a high current at the time of a breakdown, then the melted material flows into a crack in the piezoelectric layer caused by the breakdown or penetrates into the piezoelectric layer in some cases. This would cause a short-circuit path between the upper electrode layer and the lower electrode layer, thus making it difficult to resume the use of the piezoelectric actuator after the breakdown.

On the other hand, according to the configuration described above, at the time of a breakdown, the piezoelectric layer will be cut off first by melting, thus preventing the short circuit between the upper electrode layer and the lower electrode layer caused by the melting of an electrode segment.

Preferably, in the piezoelectric actuator according to the present invention, the piezoelectric layer is comprised of a plurality of piezoelectric segments which are separated in the surface direction and each of which is formed immediately below each electrode segment.

According to the configuration, the piezoelectric layer is also separated into a plurality of piezoelectric segments in the surface direction. This restrains a high current from propagating in the surface direction in the piezoelectric layer at the time of a breakdown.

Preferably, in the piezoelectric actuator according to the present invention, the electrode segments and the connection wires are formed of the same material.

The configuration enables simpler fabrication of the upper electrode layer.

Preferably, in the piezoelectric actuator according to the present invention, each connection wire has a fuse function that disconnects the connection wire in response to an energizing current of a specified value or more.

According to the configuration, at the time of a breakdown of the piezoelectric layer, a connection wire will be disconnected, thus preventing the power from being supplied to the electrode segment immediately above the location where the breakdown has taken place in the piezoelectric layer. This makes it possible to instantly end the short circuit between the upper electrode layer and the lower electrode layer.

Preferably, the piezoelectric actuator according to the present invention includes a power feeding layer that extends in the longitudinal direction in a width within a single electrode segment in the lateral direction, the power feeding layer being on the upper electrode layer, wherein the power feeding layer is connected to electrode segments at intervals in an array of the electrode segments arranged in line on the lower side.

According to the configuration, power is supplied to the plurality of electrode segments placed, being distributed in the longitudinal direction of the upper electrode layer, from the power feeding layer at appropriate intervals in the longitudinal direction. This makes it possible to suppress a voltage drop in the longitudinal direction in the upper electrode layer. Further, the width of the power feeding layer is smaller than the width of an electrode segment, and the power feeding layer is within a single electrode segment without overlapping a plurality of electrode segments in the lateral direction. Hence, even if a high current flows due to a breakdown of the piezoelectric layer immediately under an electrode segment to which the power feeding layer is connected, the high current will be prevented from reaching the electrode segments that are adjoining in the lateral direction through the power feeding layer. Further, the power feeding layer is connected to the electrode segments at intervals in the longitudinal direction. Therefore, even if a high current flows due to a breakdown of the piezoelectric layer immediately wider the electrode segment to which the power feeding layer is connected, the high current will be prevented from reaching the electrode segments that are adjoining in the longitudinal direction through the power feeding layer.

Preferably, in the piezoelectric actuator according to the present invention, the power feeding layer functions also as a power feeding wire through which power supplied from one end in the longitudinal direction is supplied to another piezoelectric actuator connected to the other end in the longitudinal direction.

A plurality of piezoelectric actuators are used by being connected in series in some cases. In such cases, each piezoelectric actuator will need a power feeding wire through which a drive voltage is supplied to the downstream side. On the other hand, the foregoing configuration enables the power feeding wire to be used to distribute power to the electrode segments, thus simplifying the structure.

BRIEF DESCRIPTION OF THE DRAWINGS

The disclosed technique will be understood and appreciated more fully from the following detailed description taken in conjunction with the drawings in which.

DESCRIPTION OF THE PREFERRED EMBODIMENTS

The present invention will now be described more fully hereinafter with reference to the accompanying drawings in which embodiments of the invention are shown. This invention may, however, be embodied in many different forms and should not be construed as limited to the illustrated embodiments set forth herein; rather, these embodiments are provided so that this disclosure will be thorough and complete, and will fully convey the scope of the invention to those skilled in the art. Like numbers refer to like elements throughout.

(Configuration of the Light Deflector)

Figure 1:
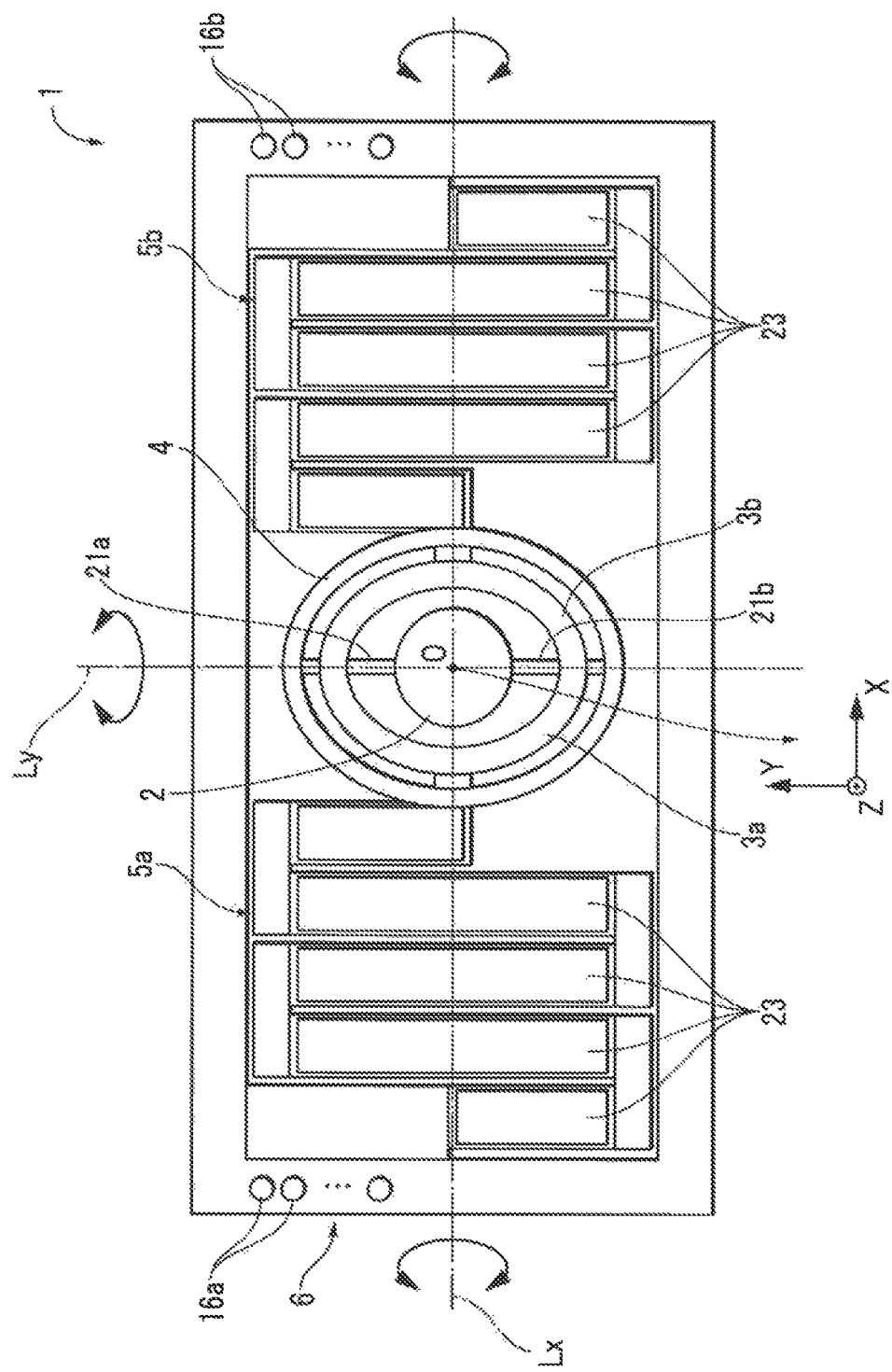
FIG. 1 is a front view of a light deflector.

FIG. 1 is a front view of a light deflector 1. The light deflector 1 is fabricated as MEMS. With respect to the light deflector 1 shaped like a flat plate, the side on which the reflecting surface of a mirror unit 2 can be visually recognized will be referred to as "the front surface" and the opposite side therefrom will be referred to as "the back surface."

Hereinafter, the top, bottom, left and right of the light deflector 1 will mean the top, bottom, left and right in the front view of the light deflector 1. For the convenience of understanding the configuration of the light deflector 1, a three-axis Cartesian coordinates is defined in FIG. 1 and the like. An origin O is set at the center of the mirror unit 2. A z-axis corresponds to the thickness direction of the light deflector 1. An X-axis and a Y-axis correspond to a horizontal direction and a vertical direction, respectively. The Z-axis denotes the direction from the back surface toward the front surface. The X-axis denotes the direction from the left toward the right. The Y-axis denotes the direction from the bottom toward the top. Hereinafter, the configuration of the light deflector 1 will be described on the assumption that the mirror unit 2 is in a stationary state, i.e. the normal line of the reflecting surface of the mirror unit 2 is in agreement with the Z-axis.

The light deflector 1 includes the mirror unit 2, inner piezoelectric actuators 3a, 3b, a movable frame 4 serving as a movable support section, outer piezoelectric actuators 5a, 5b, and a fixed frame 6. The fixed frame 6 has a horizontally long rectangular shape when viewed from the front side. The long sides and the short sides of the fixed frame 6 are parallel to the X-axis and the Y-axis, respectively.

Referring to FIG. 1, axes Lx and Ly denote the two axes around which the mirror unit 2 rotates in a reciprocating manner (forward and reverse rotation). The axes Lx and Ly orthogonally intersect at the center (the origin O) of the mirror unit 2. The inner piezoelectric actuators 3a, 3b receive a first drive voltage from a drive unit (not illustrated) and cause the mirror unit 2 to rotate at a first frequency (e.g. 30 kHz) around the axis Ly in the reciprocating manner. The outer piezoelectric actuators 5a, 5b receive a second drive voltage from the drive unit and cause the mirror unit 2 to rotate at a second frequency (e.g. 60 Hz) around the axis Lx in the reciprocating manner.

The inner piezoelectric actuators 3a, 3b are constituted of a cantilever with a piezoelectric structure and configured to be symmetrical with respect to the Y-axis when viewed from the front side. The inner piezoelectric actuators 3a, 3b are interconnected at both end parts in a Y-axis direction, and forms, as a whole, an ellipse ring that is vertically long in the Y-axis direction, encompassing the mirror unit 2. The movable frame 4 is formed to be an elliptically contoured annular frame, the inner and outer peripheries thereof being vertically long in the Y-axis direction, and encompasses the ellipse ring constituted of the inner piezoelectric actuators 3a, 3b on the inner periphery side thereof.

Torsion bars 21a, 21b vertically and linearly project along the Y-axis from the mirror unit 2, connect to the junction of the inner piezoelectric actuators 3a, 3b at a middle part, and connect to the inner periphery of the movable frame 4 at the projection ends. The axis Ly coincides with the centerlines of the torsion bars 21a, 21b.

The outer piezoelectric actuators 5a, 5b are provided on the inner periphery side of the rectangular fixed frame 6 and placed symmetrically with respect to the movable frame 4 in the X-axis direction. Each of the outer piezoelectric actuators 5a, 5b is constituted of a plurality of cantilevers 23 connected in series in a meander arrangement. As with the cantilevers (no reference numerals) of the inner piezoelectric actuators 3a, 3b, the cantilevers 23 are also provided with the piezoelectric structures. Each of the cantilevers 23 can be used alone as a piezoelectric actuator.

To be specific, the cantilevers 23 are arranged in line in the X-axis direction, with the longitudinal direction thereof being the Y-axis direction. The plurality of cantilevers 23 are connected to the cantilevers 23 that are adjoining on the right or left in the lateral direction (the X-axis direction) at the end parts in the longitudinal direction (the Y-axis direction) via folded-back parts (no reference numerals).

The cantilevers 23 at both ends in the X-axis direction in each of the outer piezoelectric actuators 5a, 5b have lengths that are half the lengths of the remaining cantilevers 23, and are connected to the fixed frame 6 and the movable frame 4 on the Y-axis. The end parts of the cantilevers 23 connected to the fixed frame 6 constitute the proximal end parts of the outer piezoelectric actuators 5a, 5b, and the end parts of the cantilevers 23 connected to the movable frame 4 constitute the distal end parts of the outer piezoelectric actuators 5a, 5b.

Electrode pads 16a, 16b are provided, each in a plural number, on the surface of each short-side part of the fixed frame 6. The electrode pads 16a are connected to the inner piezoelectric actuator 3a and the outer piezoelectric actuator 5a on the left half section of the light deflector 1 through internal wiring of the light deflector 1. The electrode pads 16b are connected to the inner piezoelectric actuator 3b and the outer piezoelectric actuator 5b on the right half section of the light deflector 1 through the internal wiring of the light deflector 1.

(Operation of the Light Deflector)

The operation of the light deflector 1 will be described. Hereinafter, when there is no particular need for discriminating between the inner piezoelectric actuators 3a and 3b, a generic term "the inner piezoelectric actuators 3" will be used. When there is no particular need for discriminating between the outer piezoelectric actuators 5a and 5b, a generic term "the outer piezoelectric actuators 5" will be used. When there is no particular need for discriminating between the electrode pads 16a, 16b, a generic term "the electrode pads 16" will be used.

The light deflector 1 is installed as a two-dimensional scanner in a video device, a vehicular headlight or the like. The light deflector 1 is housed in a package, and the electrode pads 16 of the light deflector 1 and the terminals of the package are connected by bonding wires (not illustrated). A drive voltage is supplied to the inner piezoelectric actuators 3 and the outer piezoelectric actuators 5 from the electrode pads 16 through piezoelectric layers 38 (FIG. 3B).

Light (e.g. a laser beam) from a light source (e.g. a semiconductor laser light source), which is not illustrated, enters at the center (the origin O of a three-axis coordinate system) of the mirror unit 2 of the light deflector 1.

The outer piezoelectric actuators 5 operate on the drive voltage from the electrode pad 16 to cause the movable frame 4 to rotate around the X-axis at the second frequency in the reciprocating manner. This causes the minor unit 2 to rotate around the axis Lx in the reciprocating manner at the second frequency. The axes Lx and the X-axis do not coincide with each other. This is because, since the mirror unit 2 is rotating around the axis Ly in the reciprocating manner, the axis Lx also moves as the reciprocating rotation of the axis Ly, as will be discussed hereinafter. In contrast thereto, the X-axis remains still with respect to the fixed frame 6.

The operation of the outer piezoelectric actuators 5 will be described in more detail. Each of the outer piezoelectric actuators 5 is formed of a plurality of cantilevers 23 placed in the meander arrangement. When the cantilevers 23 are numbered in a sequential order at the junction ends from the proximal end (on the fixed frame 6 side) to the distal end (on the movable frame 4 side) of the outer piezoelectric actuator 5, the odd-numbered cantilevers 23 and the even-numbered cantilevers 23 receive the drive voltages of the same frequency and opposite phases, thus deforming such that the projecting directions of the deformation curves become opposite.

As a result, among the cantilevers 23 placed in the meander arrangement, the cantilevers 23 adjoining to each other in the X-axis direction curve in the opposite directions when the outer piezoelectric actuators 5 operate. At this time, the stored amount of the relative rotation amount of the distal end part with respect to the proximal end part of each of the cantilevers 23 is the amount of rotation (the amount of torsion) of the inner piezoelectric actuators 3 around the axis Lx with respect to the outer piezoelectric actuators 5.

Meanwhile, the inner piezoelectric actuators 3 cause the torsion bars 21 to rotate, in the reciprocating manner, around the axis Ly serving as the central axis at the first frequency by the first drive voltage from the electrode pads 16. The first frequency is set at the resonant frequency of the minor unit 2 around the axis Ly so as to secure a high frequency. The second frequency, which is the frequency of the reciprocating rotation of the mirror unit 2 around the axis Lx is set to a non-resonant frequency.

Thus, the minor unit 2 rotates around the axis Lx at the non-resonant frequency in the reciprocating manner while rotating around the axis Ly at the resonant frequency in the reciprocating manner. As a result, the minor unit 2 swings to the left and right at the resonant frequency and swings up and down at the non-resonant frequency when viewed from the front side.

The axis Lx coincides with the X-axis and the axis Ly coincides with the Y-axis only when the normal line of the reflecting surface of the mirror unit 2 coincides with the Z-axis. The light from a light source (not illustrated) is reflected from the center of the minor unit 2 and is emitted as scanning light in a direction corresponding to the angle of rotation around the axis Lx or Ly on a moment-to-moment basis.

(Piezoelectric Actuator of a Comparative Example)

Figure 2A:
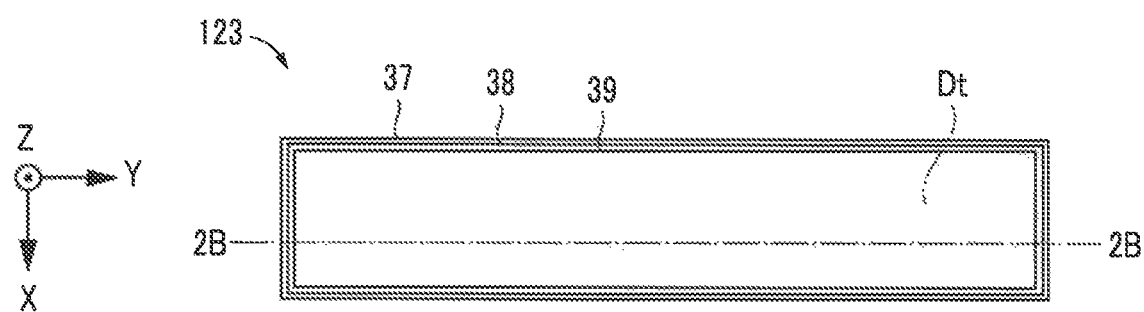
FIG. 2A is a plan view of a cantilever of a comparative example.
Figure 2B:
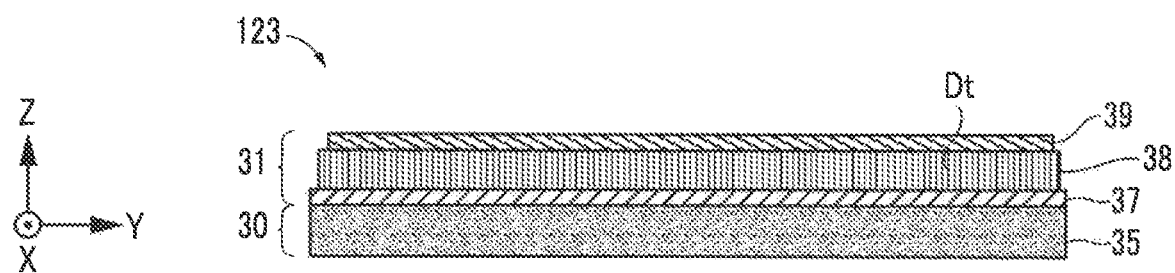
FIG. 2B is a sectional view taken on line 2B-2B of FIG. 2A.

FIG. 2A is a plan view of a cantilever 123 of a comparative example, and FIG. 2B is a sectional view taken at line 2B-2B of FIG. 2A. The cantilever 123 of the comparative example is illustrated, being compared with the cantilever 23 of the embodiment so as to clarify the features of the cantilever 23.

The plan view illustrates the piezoelectric actuator observed from above in the laminating direction (the thickness direction of the piezoelectric actuator shaped like a flat plate) and corresponds to a view of the piezoelectric actuator viewed from the front side of the light deflector 1 in FIG. 1.

The cantilever 123 is formed of a laminate construction of a substrate section 30 at the bottom and a piezoelectric structure section 31 at the top. The substrate section 30 serving as a substrate layer is constituted of only one layer, namely, a silicon (Si) layer 35. The Si layer 35 is a front surface Si layer of a silicon-on-insulator (SOI) plate, which is well known in the fabrication of semiconductors. As is well known, the SOI plate has a three-layer laminate structure constituted of a silicon dioxide ($SiO_2$) layer (not illustrated) sandwiched between the front surface Si layer 35 on the upper side and the back surface Si layer (not illustrated) on the lower side. After the piezoelectric structure section 31 is deposited on the Si layer 35 on the front surface side of the SOI plate, the SOI plate is etched from the back surface side (the lower side) to remove the back surface Si layer on the lower side and the $SiO_2$ layer at the middle. In the completed cantilever 123, only one layer, namely, the Si layer 35, is left. The thickness (the dimension in the Z-axis direction) of the Si layer 35 is, for example, 50 µm.

The piezoelectric structure section 31 has a laminate structure in which a lower electrode layer 37, a piezoelectric layer 38, and an upper electrode layer 39 are stacked in this order from bottom to top. The material of the piezoelectric layer 38 is, for example, lead zirconate titanate (PZT). The method for forming a PZT film includes, for example, a sputtering method, an ion plating method, and a metal organic chemical vapor deposition (MOCVD) method. Further, a pulse laser deposition (MD) method, a molecular beam epitaxy (MBE) method, a chemical solution deposition (CSD) method and a sol-gel method are also available. In the formation process of the piezoelectric layer 38, the continuous columnar crystals of PZT gradually grow toward the top of the lower electrode layer 37.

In the cantilever 123, the upper electrode layer 39 continues in the surface direction of the cantilever 123 shaped like a flat plate. The lateral direction and the longitudinal direction of the cantilever 123 are two directions in the surface direction.

While the light deflector 1 provided with the cantilever 123 is in operation, the first and the second drive voltages are supplied to the fixed frame 6 from an external drive voltage unit outside the light deflector 1. The first and the second drive voltages supplied to the fixed frame 6 are directed between the lower electrode layer 37 and the upper electrode layer 39 of the inner piezoelectric actuators 3 and the outer piezoelectric actuators 5 through the internal wiring of the light deflector 1. Then, the first and the second drive voltages are applied, as the applied voltages, between both surfaces of the piezoelectric layer 38 of each piezoelectric actuator of the inner piezoelectric actuators 3 and the outer piezoelectric actuators 5. The piezoelectric layer 38 expands and contracts in the longitudinal direction according to the applied voltage. With the expansion and contraction, the substrate section 30 bends in the thickness direction, and the distal end part in the longitudinal direction of the cantilever 123 is relatively displaced in the thickness direction with respect to the proximal end part.

In the cantilever 123, a breakdown of the piezoelectric layer 38 presents a problem. A breakdown tends to occur in the cantilevers 23 of the outer piezoelectric actuators 5, to which a high electric field of 10 V/µm or more has to be applied between the both surfaces of the piezoelectric layer 38 in order to secure a large amount of deflection although a low driving frequency (the foregoing second frequency) is acceptable, as in the case of the cantilever 123. In other words, a breakdown is more likely to occur in the outer piezoelectric actuators 5 having the piezoelectric layer 38 to which a higher applied voltage than that of the piezoelectric layer of the inner piezoelectric actuators 3 is applied.

As already described as a problem with the prior art, it is assumed that the piezoelectric layer 38 has incurred a breakdown. For the convenience of explanation, the position in the piezoelectric layer 38 where a first breakdown has occurred is indicated as a trigger position Dt in FIG. 2A and FIG. 2B. At the trigger position Dt, a high current flows between the lower electrode layer 37 and the upper electrode layer 39. The high current propagates in succession in the surface direction from the trigger position Dt, easily ending up as a breakdown spreading in the surface direction. In such a case, the outer piezoelectric actuators 5 will be totally disabled. In contrast thereto, according to the light deflector 1 of the embodiment, even if a breakdown of the piezoelectric layer 38 occurs at the trigger position Dt, the propagation of the breakdown in the surface direction will be controlled to a minimum, as will be discussed hereinafter in conjunction with FIG. 3A and FIG. 3B.

First Embodiment

Figure 3A:
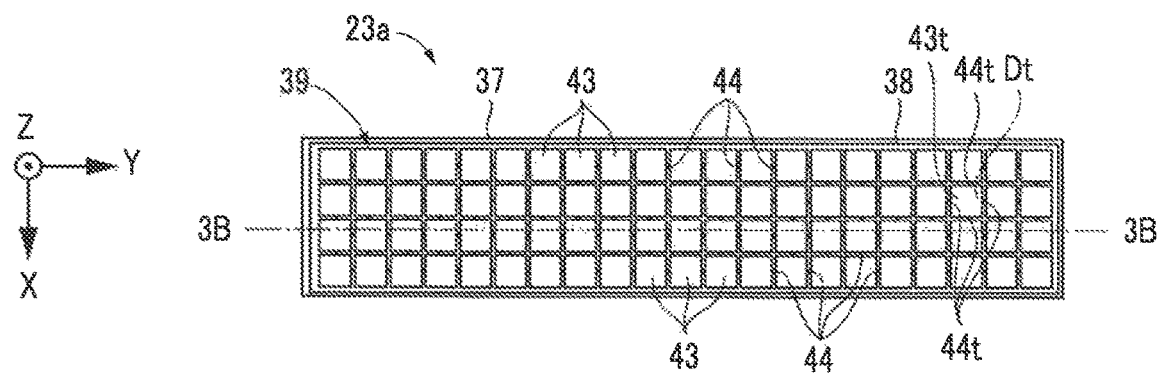
FIG. 3A is a plan view of a cantilever of an embodiment.
Figure 3B:
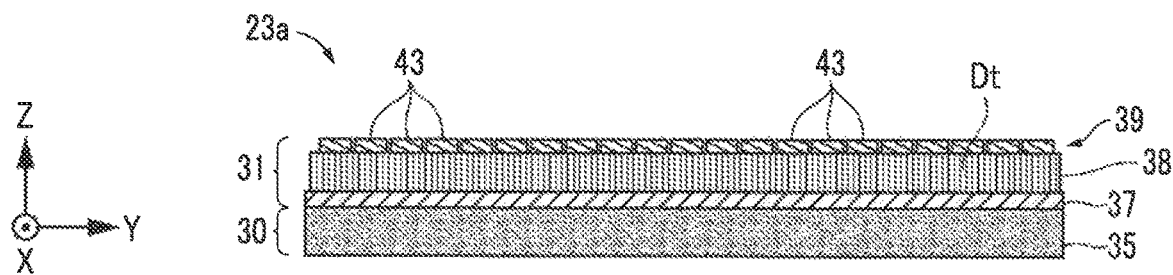
FIG. 3B is a sectional view taken on line 3B-3B of FIG. 3A.

FIG. 3A is a plan view of a cantilever 23a, which is an example of the cantilever 23 of the light deflector 1, and FIG. 3B is a sectional view taken on line 3B-3B in FIG. 3A.

Regarding the cantilever 23a, like constituent elements as the constituent elements of the cantilever 123 will be assigned like reference numerals assigned to the constituent elements of the cantilever 123. The cantilever 23a is fabricated from the cantilever 123. The cantilever 123 and the cantilever 23a differ in the structure of a piezoelectric structure section 31. The rest of the construction of the cantilever 23a is the same as that of the cantilever 123. Hence, a description will be given of the cantilever 23a, focusing mainly on the configuration of the piezoelectric structure section 31.

The piezoelectric structure section 31 of the cantilever 23a is constituted of a plurality of electrode segments 43 separated in the surface direction as the planar direction of two axes, namely, X-axis and Y-axis, and connection wires 44 that connect the electrode segments 43 that are adjoining in the surface direction.

The plurality of electrode segments 43 and the plurality of connection wires 44 in the upper electrode layer 39 of the cantilever 23a are formed by etching the piezoelectric layer 38 (FIG. 29) of the cantilever 123 from the upper side. In this example, therefore, the thicknesses of the electrode segments 43 and the plurality of connection wires 44 are the same as the thickness of the piezoelectric layer 38 of the cantilever 123. Each of the connection wires 44 is formed to have a small width so as to provide a fuse function (to cut the connection wires 44 by melting in case of the occurrence of a breakdown), which will be discussed hereinafter, but is formed not to be excessively narrow.

Each of the electrode segments 43 is formed to be square in a plan view. The connection wires 44 extend between the midpoints of the opposing sides of the electrode segments 43 that are adjoining in the X-axis direction and the Y-axis direction. Referring to FIG. 3A, the black lines indicated in the gap between the adjoining electrode segments 43 denote the connection wires 44. Each of the connection wires 44 connects the electrode segments 43 at both ends.

The operation of the cantilever 23a will be described. At a first breakdown, a high current that penetrates a trigger position Dt in the Z-axis direction appears between a lower electrode layer 37 and an upper electrode layer 39, as with the cantilever 123. The high current flows not only through the trigger position Dt, which is the one location in the surface direction, but also reaches the surrounding area in contact with the trigger position Dt in the surface direction.

As a result, the breakdown is apt to propagate in the surface direction, centering around the trigger position Dt, as in the case of the cantilever 123. However, the spreading of the high current in the surface direction is limited to one lectrode segment 43 in the area in the surface direction that includes the trigger position Dt in the surface direction. As a result, the breakdown of the piezoelectric layer 38 is restrained to the area in the surface direction of the one electrode segment 43 that includes the trigger position Dt in the surface direction.

Thus, in the cantilever 23a, the total functional damage will be avoided, although a breakdown may occur due to a defect, such as a void, in the piezoelectric layer 38.

The fuse function of the connection wires 44 will be described. The connection wires 44 are formed to have a narrow width in a plan view. In case of a breakdown of the piezoelectric layer 38, current flows in a concentrative manner to the electrode segment 43 immediately above the trigger position Dt (hereinafter referred to as "the trigger electrode segment 43t") from the surrounding area through the connection wires 44. Hence, an energizing current of a specified value or more passes through the connection wires 44 extending from the trigger electrode segment 43t of the trigger position Dt (hereinafter referred to as "the trigger connection wires 44t"). Further, in case of a breakdown of the piezoelectric layer 38 caused by a high current, high heat is generated at the trigger position Dt. Thus, the trigger connection wires 44t are instantly cut by melting by the heat generated due to the energizing current of the specified value or more and/or the high heat propagated from the trigger position Dt.

As a result, the supply of current to the trigger electrode segment 43t is cut off, instantly ending the breakdown of the piezoelectric layer 38. In other words, the propagation of the breakdown in the surface direction in the piezoelectric layer 38 is suppressed.

Each of the electrode segments 43 is connected through the connection wires 44 to the electrode segments 43 adjoining thereto in both longitudinal and lateral directions. Therefore, each of the electrode segments 43 can receive the drive voltage supplied through the connection wires 44 shared with other adjoining non-trigger electrode segments 43 even if the connection, through the trigger connection wire 44t, with the trigger electrode segment 43t is cut off due to the electrode segment 43 adjoining thereto being the trigger electrode segment 43t.

Other Embodiments

Figure 4A:
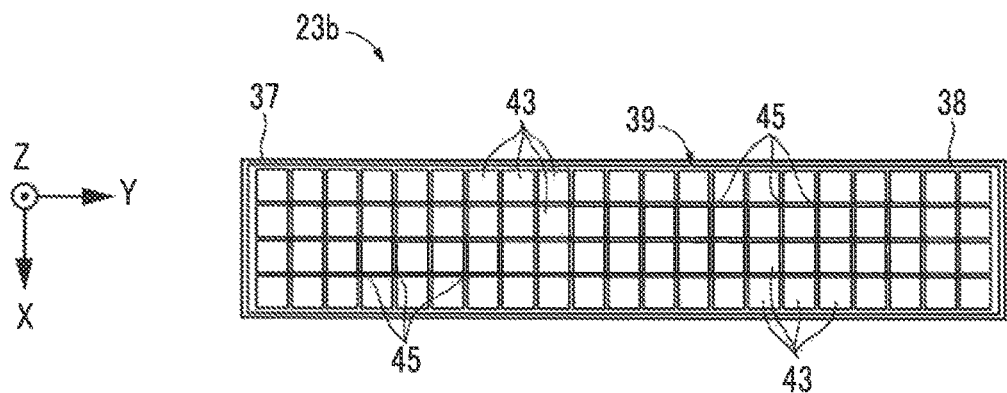
FIG. 4A to FIG. 4C are plan views of the cantilevers of various embodiments.
Figure 4B:
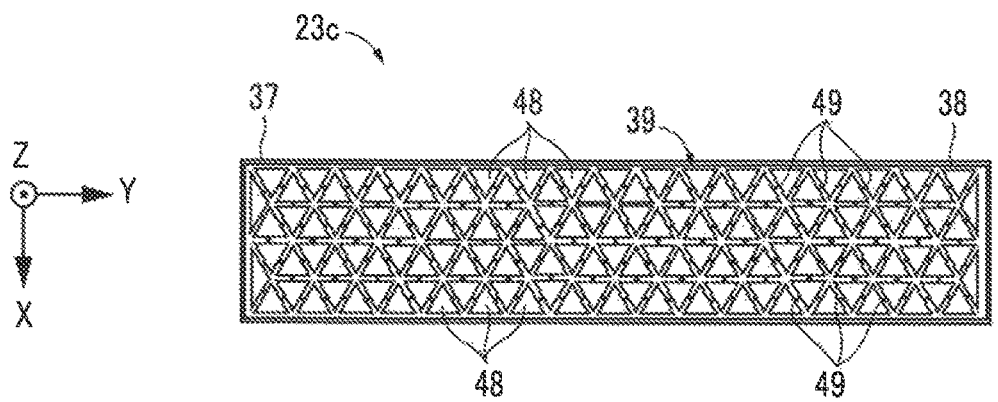
Figure 4C:
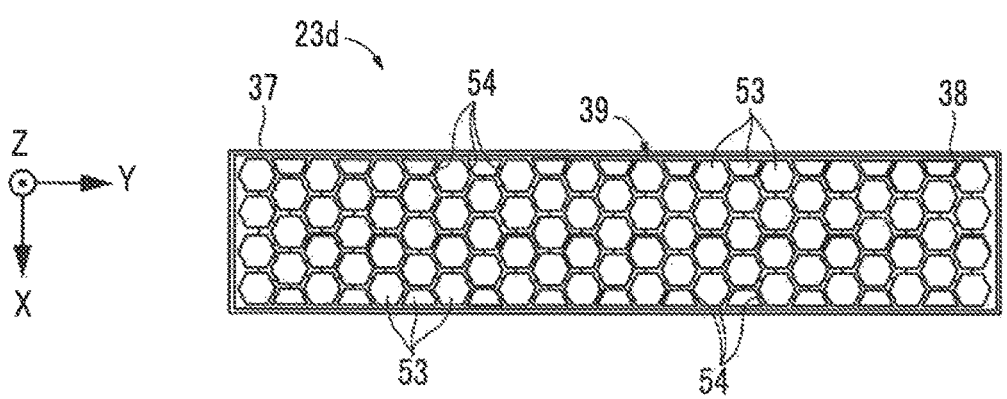

FIG. 4A to FIG. 4C illustrate cantilevers 23b to 23d, which are various embodiments of the cantilever 23 of FIG. 1. For the cantilevers 23b to 23d, the longitudinal sectional views thereof are omitted, and only the plan views thereof are presented. Only the differences from the cantilever 23a will be described. Hereinafter, cantilevers 23a to 23f (the cantilevers 23e and 23f being illustrated in FIG. 5A to FIG. 6B) will be generically referred to as "the cantilevers 23" unless there is a need to discriminate between these cantilevers.

The cantilever 23b of FIG. 4A is provided with connection wires 45 in place of the connection wires 44 of the cantilever 23. In the case of the connection wires 44 (FIG. 3A), the midpoints of the opposing sides of the electrode segments 43 that are adjoining in the surface direction are connected. In comparison, the connection wires 45 of the cantilever 23b connect the opposing vertexes of the electrode segments 43 that are adjoining in the surface direction. Referring to FIG. 4A, each of the connection wires 45 is provided at the crossroad defined by the vertexes of four electrode segments 43 and connects together the four vertexes bordering on the crossroad.

In the cantilever 23c of FIG. 4B, electrode segments 48 and connection wires 49 are formed in place of the electrode segments 43 and the connection wires 44, respectively, of the cantilever 23a (FIG. 3A). The electrode segments 48 have equilateral triangular shapes in a plan view. In each pair of two electrode segments 48, which are adjoining to each other in the surface direction and which have their sides opposing to each other, the connection wires 49 connect the midpoints of the opposing sides. In order to obtain minute filling of the electrode segments 48, the pairs of the electrode segments 48 having their sides opposing to each other in the X-axis direction are formed in a diamond shape in a plan view.

In the cantilever 23d of FIG. 4C, electrode segments 53 and connection wires 54 are formed in place of the electrode segments 43 and the connection wires 44, respectively, of the cantilever 23a (FIG. 3A). The electrode segments 53 have regular hexagon shapes in a plan view. In each pair of two electrode segments 53, which are adjoining to each other in the surface direction and which have their sides opposing each other, the connection wires 54 connect the midpoints of the opposing sides. In order to obtain minute filling of the electrode segments 53, each group consisting of a plurality of electrode segments 53 arranged with their centers aligned in the Y-axis direction is staggered by ½ pitch in the X-axis direction with respect to a group that is adjoining in the Y-axis direction. One pitch means the width as a dimension of one electrode segment 53 in the X-axis direction.

(Another Structure of the Piezoelectric Layer)

Figure 5A:
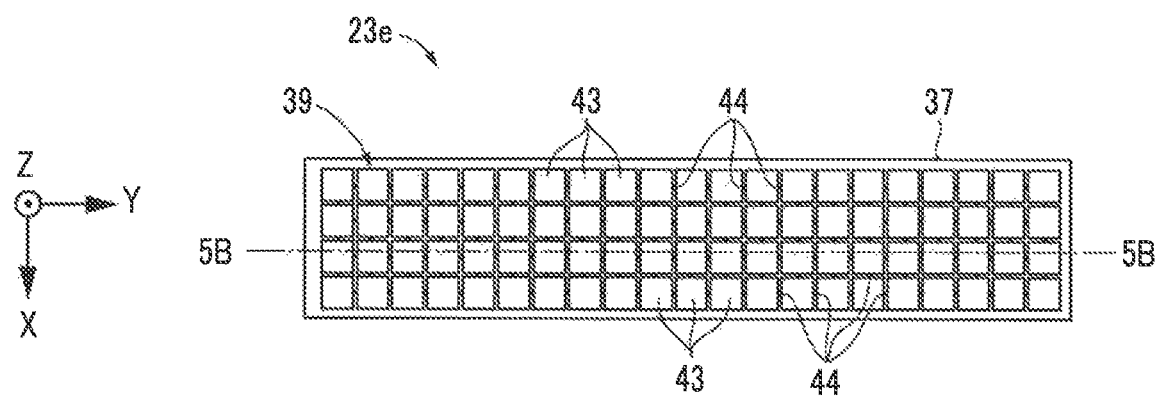
FIG. 5A is a plan view of a cantilever in which a piezoelectric layer is constituted of a plurality of piezoelectric segments.
Figure 5B:
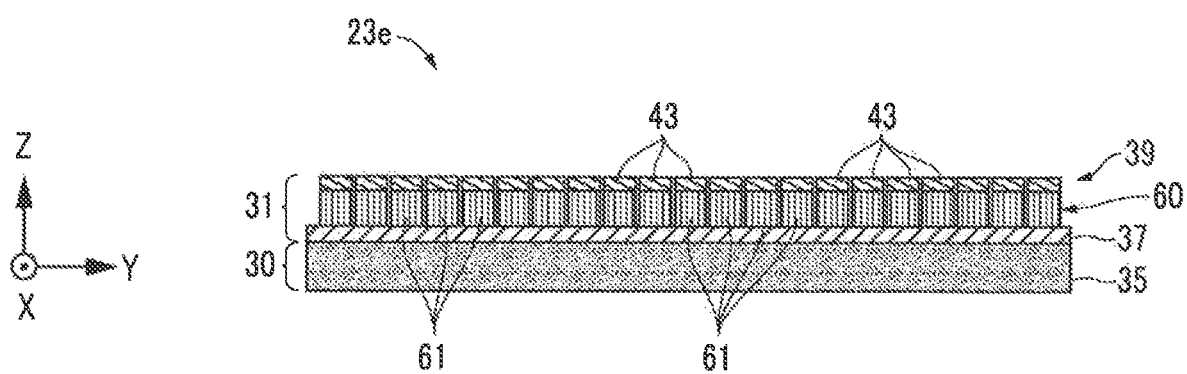
FIG. 5B is a sectional view taken on line 5B-5B of FIG. 5A.

FIG. 5A is a plan view of a cantilever 23e provided with a piezoelectric layer 60, which is different from the piezoelectric layer 38 of the cantilever 23a, and FIG. 5B is a sectional view taken on line 5B-5B of FIG. 5A. The configuration of the cantilever 23e will be described only as it differs from the configuration of the cantilever 23a.

In the cantilever 23e, a piezoelectric layer 60 is constituted of a plurality of piezoelectric segments 61, which are separated in the surface direction and each of which is formed immediately under each of electrode segments 43. This means that, in the cantilever 23e, the piezoelectric layer 60 as well as an upper electrode layer 39 are separated in the surface direction.

The electrode segments 43 and the piezoelectric segments 61 that are located at the same position in the surface direction (the thickness direction) constitute pairs. The electrode segment 43 and the piezoelectric segment 61 of each pair are integral in the thickness direction. Thus, the pairs are separated in both longitudinal and lateral directions within the surface direction, and the pairs that are adjoining in the surface direction are connected through the connection wires 44 to a plurality of upper electrode layers 39 that are adjoining in both directions.

As a result, the spreading of a high current in the surface direction at the start of a breakdown to the range of the piezoelectric layer 60 as well as the range of the upper electrode layers 39 in the Z-axis direction will be prevented. Hence, the propagation of the breakdown in the surface direction can be securely prevented.

(Power Feeding Layer)

Figure 6A:
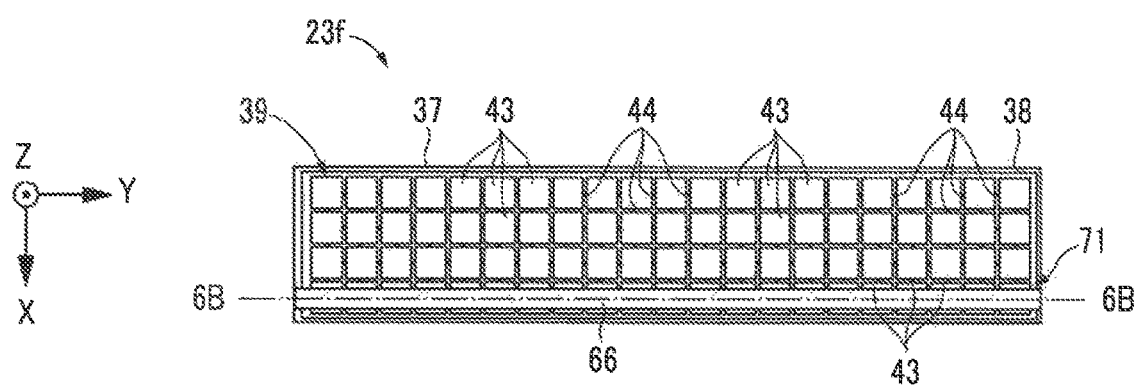
FIG. 6A is a plan view of a cantilever provided with a power feeding layer.
Figure 6B:
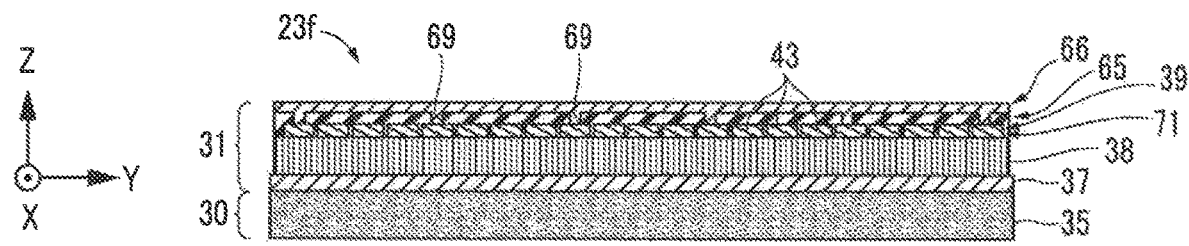
FIG. 6B is a sectional view taken on line 6B-6B of FIG. 6A.

FIG. 6A is a plan view of the cantilever 23f provided with a power feeding layer 66, and FIG. 6B is a sectional view taken on line 6B-6B of FIG. 6A. The configuration of the cantilever 23f will be described only about a difference from the configuration of the cantilever 23a of FIG. 2B.

In comparison with the piezoelectric structure section 31 of the cantilever 23a, a piezoelectric structure section 31 of the cantilever 23f has additional two layers, namely, an insulating layer 65 and the power feeding layer 66 stacked in this order from the bottom, which are deposited on the upper side of an upper electrode layer 39. The plan view of FIG. 6A omits illustrating the insulating layer 65, so that the internal structure is visible. The insulating layer 65 covers the entire front surface (the upper surface) of the upper electrode layer 39.

The power feeding layer 66 extends in the Y-axis direction, the width thereof being within the inner side of a single electrode segment 43 in the X-axis direction. The power feeding layer 66 is connected to the electrode segments 43 at intervals in the array of the electrode segments 43 arranged in line in the Y-axis direction on the lower side (hereinafter referred to as "the power feeding array 71").

Hereinafter, in the cantilever 23 (the generic term of the cantilevers 23a to 23f), a common (the same potential) drive voltage is required to be supplied to the electrode segments 43 of the upper electrode layer 39. However, the connection wires 44 are narrow, thus having high resistance. This causes a voltage drop in a power feeding direction (toward the other end side, which is the distal end side that is far from one end, which is the proximal end closer to electrode pads 16), inconveniently leading to a drop in the drive voltage supplied to the electrode segments 43 on the downstream side in the power feeding direction.

The outer piezoelectric actuators 5 of the light deflector 1 need a wire for supplying the drive voltage to each of the plurality of (two or more) cantilevers 23 in the meander arrangement. The power feeding layer 66 serves also as the wire.

In the cantilever 23f, power is supplied to the plurality of electrode segments 43, which are placed by being distributed in the longitudinal direction of the upper electrode layer 39, from the power feeding layer 66 at appropriate intervals in the longitudinal direction (at the longitudinal intervals of via holes 69). The power feeding layer 66 is sufficiently wide with respect to the connection wires 44, so that the same drive voltage that has not dropped is supplied along a power feeding array 71 to the electrode segments 43 connected to the power feeding layer 66 (hereinafter referred to as "the directly connected electrode segments 43"). Further, the electrode segments 43 not directly connected to the power feeding layer 66 (hereinafter referred to as "the indirectly connected electrode segments 43") receive the drive voltage from one or two directly connected electrode segments 43 that are the closest ones following an n (n≥0) number or more indirectly connected electrode segments 43 from the directly connected electrode segments 43. Further, the maximum value of n is set to be sufficiently small, so that a drop in the drive voltage in the indirectly connected electrode segments 43 will be small. Thus, in the cantilever 23f, the drive voltage free of a voltage drop can be supplied to all the electrode segments 43.

In the cantilever 23f, the width of the power feeding layer 66 is smaller than the width of the electrode segments 43, and the power feeding layer 66 is accommodated within a single electrode segment 43 in the X-axis direction. As a result, when the directly connected electrode segments 43 become the trigger electrode segments 43t, even if a high current flows into the directly connected electrode segments 43, the high current is prevented from spreading through the power feeding layer 66 to the indirectly connected electrode segments 43 adjoining in the direction of the piezoelectric actuator.

Further, in the cantilever 23f, the power feeding layer 66 is connected to the electrode segments 43 of the power feeding array 71 at intervals in the longitudinal direction. With this arrangement, even if the directly connected electrode segments 43 to which the power feeding layer 66 is connected become the trigger electrode segments 43t, causing a high current to flow into the directly connected electrode segments 43, the high current will be prevented from spreading through the power feeding layer 66 to the electrode segments 43 that are adjoining in the power feeding array 71.

(Examples of Values)

In contrast to the upper electrode layer 39 of the cantilever 123, which is formed of a single flat layer, covering substantially the entire surface of the piezoelectric layer 38, the upper electrode layer 39 of the cantilever 23 is separated into the plurality of electrode segments 43, 48 or 53 (hereinafter referred to as "the electrode segments 43 or the like"), which are separated in the surface direction, and the total area of the electrode segments 43 or the like will be the area to which an applied voltage is applied in the piezoelectric layer 38. Each of the electrode segments 43 or the like will be a minimum breakdown unit in the cantilever 23 in case of a breakdown of the piezoelectric layer 38, thereby restricting the breakdown in the cantilever 23 to a single electrode segment 43 or the like. For this reason, the dimensions of the electrode segments 43 or the like are preferably smaller. For example, the area of each of the electrode segments 43 or the like is set to be 10% or less of the area of the entire region where the upper electrode layer 39 is formed or the area of the entire piezoelectric layer 38.

If the area of the entire region where the upper electrode layer 39 is formed is set to 5 mm$^2$, then each of the electrode segments 43, which have a square shape in a plan view, is set to 100 μm×100 μm. This means that "the area of the electrode segment 43/the total area of the upper electrode layer 39≈0.2%." Setting to these values guarantees that the cantilever 23 as a whole can be used without trouble even if the piezoelectric layer 38 corresponding to one electrode segment 43 or the like incurs a malfunction in the cantilever 23.

The gap between the electrode segments 43 or the like that are adjoining in the surface direction (e.g. the length of the connection wires 44) is preferably small. However, in order to accomplish a stable lithography process, the dimension of the gap is set such that the electrode segments 43 or the like that are adjoining in the surface direction are placed apart in the surface direction by at least 5 μm or more according to current technology. Hence, in the electrode segment 43, which is square in a plan view, or the electrode segment 48, which is equilateral-triangular in a plan view, the length of one side is preferably set to be 20 μm or more for the total area of the electrode segments 43 or the like to secure 60% or more of the area of the entire region where the upper electrode layer 39 is formed (hereinafter referred to as "the upper electrode covering percentage"). In the cantilever 23*d*, in which the electrode segments 53 have regular hexagon shapes in a plan view, one side of the regular hexagon shape is preferably set to 12 μm or more to secure the same upper electrode covering percentage.

As described above, the connection wires 44, 45, 48 and 54 (hereinafter referred to as "the connection wires 44 or the like") will be cut by melting attributed to the heat generated by concentrated current if a breakdown occurs in a region of the piezoelectric layer 38 immediately below one electrode segment 43 or the like to which the connection wires are connected. For this reason, the width of the connection wires or the like is preferably set to 20 μm or less. By providing the connection wires 44 or the like with a fuse function that disconnects the connection wires 44 if a current of a specified value or more passes therethrough, the breakdown current can be instantly stopped in case of a breakdown, thus restraining damage to the piezoelectric layer 38 caused by the breakdown.

The material of the upper electrode layer 39 preferably has a melting point that is higher than the material of the piezoelectric layer 38. This is because, if the melting point of the upper electrode layer 39 is lower than that of the piezoelectric layer 38, then the melted material of the upper electrode layer 39 may flow into a crack in the piezoelectric layer 38 caused by a breakdown in case of piezoelectric destruction, possibly leading to a short circuit between the lower electrode layer 37 and the upper electrode layer 39. To avoid this, the upper electrode layer 39 should not be made excessively thick. It is desirable, therefore, to form the upper electrode layer 39 by a thin film using a type of material which has a melting point that is higher than that of the material constituting the piezoelectric layer 38. More specifically, the material of the upper electrode layer 39 is, for example, Pt, Ti or Ir, and the upper electrode layer 39 is formed to have a layer thickness of 200 nm or less.

The width of the power feeding layer 66 is preferably minimized. For example, the ratio of the width of the power feeding layer 66 to the width of the electrode segment 43 is desirably set to ⅓ or less and further desirably set to ¹⁄₁₀ or less. However, the width is set to be sufficiently larger than the connection wire 44 or the like provided with the fuse function.

(Modification Examples)

In the cantilever 23*a*, the upper electrode layer 39 has a plurality of electrode segments 43 separated in both the X-axis direction and the Y-axis direction. According to the present invention, however, the separation may be only in one of the X-axis direction and the Y-axis direction.

The description has been given about the cantilever 23 of the outer piezoelectric actuators 5 in conjunction with FIG. 3A to FIG. 6B. However, the separation structure of the piezoelectric layer 38 in the cantilever 23 is not limited to a piezoelectric actuator having the rectangular flat-plate-like shape, as with the outer piezoelectric actuators 5. The piezoelectric actuator in accordance with the present invention is applicable also to a piezoelectric actuator having a curved (e.g. elliptical) flat plate shape in a plan view, as with the inner piezoelectric actuators 3. In the piezoelectric actuator having the curved flat plate shape, the longitudinal direction is the direction in which the piezoelectric actuator extends lengthwise (e.g. the direction in which an elliptical contour line extends). Further, the width direction is the lateral direction.

In the embodiments, the square, the equilateral triangular or the regular hexagonal shapes in a plan view have been illustrated as the minute structures of the electrode segments of the upper electrode layer 39. According to the present invention, minute structures of other shapes can be also adopted.

In the embodiments, a thickness Ha of the piezoelectric layer 38 in the form of the continuous flat layer before separation in the cantilever 123, a thickness Hb of the electrode segments, such as the electrode segments 43 or the like, and a thickness Hc of the connection wires, such as the connection wires 44 or the like, have a relationship denoted by Ha=Hb=Hc. According to the present invention, the relationship may be Ha=Hb>Hc insofar as the fuse function of the connection wires in case of a breakdown is secured. Further, in the case where Hb>Hc, the fuse function of the connection wires can be secured by appropriately increasing the width of the connection wires.

It will be appreciated by persons skilled in the art that the disclosed technique is not limited to what has been particularly shown and described hereinabove. Rather the scope of the disclosed technique is defined only by the claims, which follow.

What is claimed is:

1. A piezoelectric actuator which has a rectangular flat plate shape and in which a substrate layer, a lower electrode layer, a piezoelectric layer, and an upper electrode layer are formed in this order from bottom to top in a thickness direction,
    wherein the upper electrode layer formed on the piezoelectric layer is constituted of (i) a plurality of electrode segments separated in a surface direction and (ii) connection wires, and
    wherein the connection wires connect respective adjoining pairs of electrode segments which are formed on the piezoelectric layer and that are adjoining in the surface direction, and each connection wire is positioned in a gap between its corresponding adjoining pair of electrode segments.

2. The piezoelectric actuator according to claim 1, wherein the plurality of electrode segments are separated in both longitudinal and lateral directions of the surface direction, and the connection wires connect the electrode segments that are adjoining in both the longitudinal and lateral directions.

3. The piezoelectric actuator according to claim 2, wherein each electrode segment has a same size and shape.

4. The piezoelectric actuator according to claim 3, wherein each connection wire has a smaller width than a width of the respective electrode segments along the surface direction.

5. The piezoelectric actuator according to claim 2, wherein each connection wire extends between midpoints of opposing sides of its corresponding adjoining pair of electrode segments.

6. The piezoelectric actuator according to claim 5, wherein each connection wire has a smaller width than a width of the respective electrode segments along the surface direction.

7. The piezoelectric actuator according to claim 1, wherein the upper electrode layer is formed of a material that has a higher melting point than a material from which the piezoelectric layer is formed.

8. The piezoelectric actuator according to claim 1, wherein the piezoelectric layer is constituted of a plurality of piezoelectric segments which are separated in the surface direction and each of which is formed immediately below a respective one of the plurality of electrode segments.

9. The piezoelectric actuator according to claim 1, wherein the electrode segments and the connection wires are formed of a same material.

10. The piezoelectric actuator according to claim 1, wherein each connection wire has a fuse function that disconnects a connection wire in response to an energizing current of at least a specified value.

11. The piezoelectric actuator according to claim 1, further comprising:
a power feeding layer that extends in a longitudinal direction in a width within a single electrode segment in a lateral direction, the power feeding layer being on the upper electrode layer,
wherein the power feeding layer is connected to electrode segments at intervals in an array of the electrode segments arranged in line on a lower side.

12. The piezoelectric actuator according to claim 11, wherein the power feeding layer functions also as a power feeding wire through which power supplied from one end in the longitudinal direction is supplied to another piezoelectric actuator connected to the other end in the longitudinal direction.

13. The piezoelectric actuator according to claim 1, wherein the connection wires are formed on the piezoelectric layer.

14. The piezoelectric actuator according to claim 13, wherein the plurality of electrode segments are separated in both longitudinal and lateral directions of the surface direction, and the connection wires connect the electrode segments that are adjoining in both the longitudinal and lateral directions.

15. The piezoelectric actuator according to claim 14, wherein each connection wire extends between midpoints of opposing sides of its corresponding adjoining pair of electrode segments.

16. The piezoelectric actuator according to claim 15, wherein each connection wire has a smaller width than a width of the respective electrode segments along the surface direction.

17. A light deflector comprising:
the piezoelectric actuator according to claim 1; and
a rotating mirror driven by the piezoelectric actuator.

* * * * *